(12) United States Patent
Yang et al.

(10) Patent No.: US 10,750,278 B2
(45) Date of Patent: Aug. 18, 2020

(54) ADAPTIVE BASS PROCESSING SYSTEM

(71) Applicant: Creative Technology Ltd, Singapore (SG)

(72) Inventors: Jun Yang, San Jose, CA (US); Klaas Vogelsang, Fremont, CA (US); Robert Ridder, Santa Cruz, CA (US); Steven Verity, Santa Clara, CA (US)

(73) Assignee: Creative Technology Ltd, Singapore (SG)

( * ) Notice: Subject to any disclaimer, the term of this patent is extended or adjusted under 35 U.S.C. 154(b) by 0 days.

(21) Appl. No.: 16/195,767

(22) Filed: Nov. 19, 2018

(65) Prior Publication Data

US 2019/0141441 A1    May 9, 2019

Related U.S. Application Data

(63) Continuation of application No. 14/404,381, filed as application No. PCT/US2013/043194 on May 29, 2013, now abandoned.

(Continued)

(51) Int. Cl.
*H04R 3/00* (2006.01)
*H04R 3/04* (2006.01)
(Continued)

(52) U.S. Cl.
CPC ................. *H04R 3/00* (2013.01); *H03G 3/20* (2013.01); *H04R 3/04* (2013.01); *H04S 1/00* (2013.01);
(Continued)

(58) Field of Classification Search
CPC ... H04R 3/00; H04R 3/04; H04R 5/04; H04R 2430/03; H04R 2499/11; H04R 3/12; H04R 5/033; H04R 1/1083; H04R 2430/20; H04R 2201/403; H04R 2225/43; H04R 2410/05; H04R 2460/01; H04R 3/005; H04R 1/38; H04R 2203/12; H04R 2225/023; H04R 2225/025; H04R 2460/13; H04R 25/00; H04R 25/453; H04R 25/48; H04R 25/60; H04R 25/604; H04R 29/001; H04R 3/007; H04R 1/02; H04R 1/403; H04R 2201/405;
(Continued)

(56) References Cited

U.S. PATENT DOCUMENTS

| 7,054,455 B2 | 5/2006 | Aarts |
| 8,386,242 B2 | 2/2013 | Kim et al. |

(Continued)

FOREIGN PATENT DOCUMENTS

| CN | 1805612 A | 7/2006 |
| DE | 10119094 A1 | 10/2002 |

(Continued)

*Primary Examiner* — Akelaw Teshale
(74) *Attorney, Agent, or Firm* — Russell Swerdon; Desmund Gean

(57) ABSTRACT

An effective and simple psychoacoustic bass generation system generates a harmonic signal having inter-modulation controllable to remain below a threshold level and includes a high-pass filter configured to pass harmonics which are reproducible with fidelity by the loudspeaker or other transducer and a loudness matching block configured to compensate the loudness of the desired harmonics to match the loudness of the original signal.

20 Claims, 4 Drawing Sheets

Related U.S. Application Data

(60) Provisional application No. 61/652,816, filed on May 29, 2012.

(51) Int. Cl.
    *H04S 7/00*           (2006.01)
    *H04S 1/00*           (2006.01)
    *H03G 3/20*          (2006.01)
    *H04S 3/00*           (2006.01)

(52) U.S. Cl.
    CPC ............... *H04S 7/00* (2013.01); *H04S 7/307* (2013.01); *H04S 3/00* (2013.01)

(58) Field of Classification Search
    CPC ............ H04R 2420/07; H04R 2420/09; H04R 29/002; H04R 3/002; H04R 1/1008; H04R 1/1016; H04R 1/1041; H04R 1/22; H04R 2201/023; H04R 2430/00; H04R 2430/01; H04R 25/505; H04R 25/554; H04R 25/558; H04R 27/00; H04R 3/14; H04R 5/02; H04S 7/307; H04S 7/00; H04S 1/00; H04S 3/00; H03G 3/20
    See application file for complete search history.

(56) References Cited

U.S. PATENT DOCUMENTS

| | | |
|---|---|---|
| 8,416,965 B2 | 4/2013 | Hung |
| 8,855,332 B2 | 10/2014 | Choi et al. |
| 2006/0159283 A1* | 7/2006 | Mathew ............... H04R 3/04 381/98 |
| 2008/0170721 A1* | 7/2008 | Sun .................. G10L 21/038 381/98 |
| 2009/0052695 A1* | 2/2009 | Yamada ............... H03G 9/025 381/101 |
| 2009/0147963 A1 | 6/2009 | Smith |
| 2010/0158272 A1* | 6/2010 | Vickers ................ H04R 3/04 381/98 |
| 2010/0232624 A1 | 9/2010 | Zhang |
| 2011/0135115 A1* | 6/2011 | Choi ................. H04S 7/307 381/107 |
| 2012/0020480 A1* | 1/2012 | Visser ................. H04R 3/12 381/17 |
| 2012/0259626 A1* | 10/2012 | Li ................... H04R 1/1083 704/226 |
| 2013/0003989 A1* | 1/2013 | Tsang ............... G10L 21/0364 381/102 |
| 2015/0092973 A1 | 4/2015 | Risberg |

FOREIGN PATENT DOCUMENTS

| | | |
|---|---|---|
| EP | 2023671 A2 | 2/2009 |
| JP | 2006222867 A | 8/2006 |
| JP | 2009244650 A | 10/2009 |
| WO | 98/46044 A1 | 10/1998 |

\* cited by examiner

ADAPTIVE BASS PROCESSING SYSTEM

This Application is a Continuation of U.S. patent application Ser. No. 14/404,381, filed 26 Nov. 2014, which is a National Stage (§ 371) of International Application No. PCT/US2013/043194, filed 29 May 2013, which claims the benefit of priority from U.S. Provisional Application No. 61/652,816, filed 29 May 2012, which applications are incorporated by reference herein in their entireties.

BACKGROUND OF THE INVENTION

1. Field of the Invention

The present invention relates to methods for enhancing bass in audio reproduction systems. More particularly, the present invention relates to the exploitation of psychoacoustic principals to increase the perception of bass to listeners in audio reproduction systems. This invention proposes an effective and simple psychoacoustic bass generation scheme with good audio performance.

2. Description of the Related Art

Nowadays, speakers in audio devices are trending smaller in size. One problem inherent in small-sized speakers is their inability to reproduce low-frequency bass signals very well due to their poor low-frequency response associated with their physical size limitations. The traditional approach in addressing the poor low-frequency response problem is to simply boost the low-frequency content of the signal. However, this approach will increase power consumption due to heat generation by the speaker, resulting in distortion and possibly speaker overload.

A more advanced approach is to use psychoacoustic signal processing to enhance bass perception on the basis of the "principle of the missing fundamental."

Many existing psychoacoustic bass systems have either used a sophisticated Nonlinear Processor (NLP) or used a sophisticated psychoacoustic bass generation algorithm, which are too complicated to implement in real-time.

Although some psychoacoustic bass systems have used the simple NLPs, their higher order harmonics may decay too slowly for satisfactory performance. Or, their NLPs will result in infinite number of harmonics. In order to accurately render the outputs without excess artifacts, those bass systems need an extra low-pass filter (LPF) (or band-pass filter including such LPF) or other post-processing at the output of NLPs to reduce the artifacts. Otherwise, such NLPs may result in audible inter-modulation distortion. In addition, it may be difficult to precisely control their harmonic decay pattern (i.e., relative magnitudes of the harmonics).

Some available psychoacoustic bass systems use harmonic generators that only produce even harmonics or odd harmonics, not all harmonics. In addition, even though harmonics are needed, not all the NLPs generate the same perceptual bass perception.

Further, the harmonics in some available bass enhancement systems will diminish when the input signal level is low or when the cutoff frequency (fc) of the speaker is very low. Further still, many available psychoacoustic bass systems apply a linear gain to control the harmonic strength in the system output and don't consider the loudness matching between the generated harmonics and the original low frequencies.

These problems prevent these technologies and their products from being widely accepted by customers and from being practically used. It is one goal of this invention to attack the above problems while providing an effective and simple psychoacoustic bass system in a real-time implementation. Accordingly, what is needed is an effective and simple psychoacoustic bass generation scheme.

SUMMARY OF THE INVENTION

To achieve the foregoing, the present invention provides an effective and simple psychoacoustic bass generation scheme with good audio performance. According to one embodiment, a bass generation system includes six processing units: (1) an adaptive low frequency signal extractor; (2) an adaptive adjustor of harmonic decay pattern; (3) a non-linear processor (NLP) for generating the desired harmonic signals with the inter-modulation under control; (4) a high-pass filter to obtain the harmonics which are well-reproduced by the loudspeaker; (5) a loudness matching block to compensate for the loudness of the desired harmonics with the original low frequency signal which is unable to be reproduced by the loudspeaker so as to generate the psychoacoustic bass; and (6) an output mixer which sums the high-pass filtered raw data with the psychoacoustic bass.

According to one embodiment, the method for generating psychoacoustic bass comprises an effective nonlinear processor having an adjustable harmonic decay pattern coupled to an adaptive automatic adjustor of harmonic decay pattern According to another embodiment, a system configured for generating psychoacoustic bass comprises an adaptive adjustor of harmonic decay pattern.

According to yet another embodiment, after the desired harmonic signals are generated with controlled intermodulation, the system provides compensation for the loudness of the desired harmonics for the original low frequency signal which is unable to be reproduced by the loudspeaker.

With the proposed bass generation system including adaptive adjustment of harmonic decay pattern and the proposed non-linear processor (NLP), the degree of nonlinearity consistently reaches a desired value while remaining independent of the cutoff frequency of speakers and the level of the input audio signal. Therefore, the proposed systems and methods provide listeners with good sensation of the low frequency of the sound signal even when bass restricted loudspeakers or other poor loudspeakers are used. Accordingly, the invention embodiments offer an effective solution for a variety of bass enhancement and generation applications.

These and other features and advantages of the present invention are described below with reference to the drawings.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known mechanisms have not been described in detail in order not to unnecessarily obscure the present invention.

It should be noted herein that throughout the various drawings like numerals refer to like parts. The various drawings illustrated and described herein are used to illustrate various features of the invention. To the extent that a particular feature is illustrated in one drawing and not another, except where otherwise indicated or where the structure inherently prohibits incorporation of the feature, it is to be understood that those features may be adapted to be included in the embodiments represented in the other figures, as if they were fully illustrated in those figures. Unless otherwise indicated, the drawings are not necessarily to scale. Any dimensions provided on the drawings are not intended to be limiting as to the scope of the invention but merely illustrative.

Figure 1:
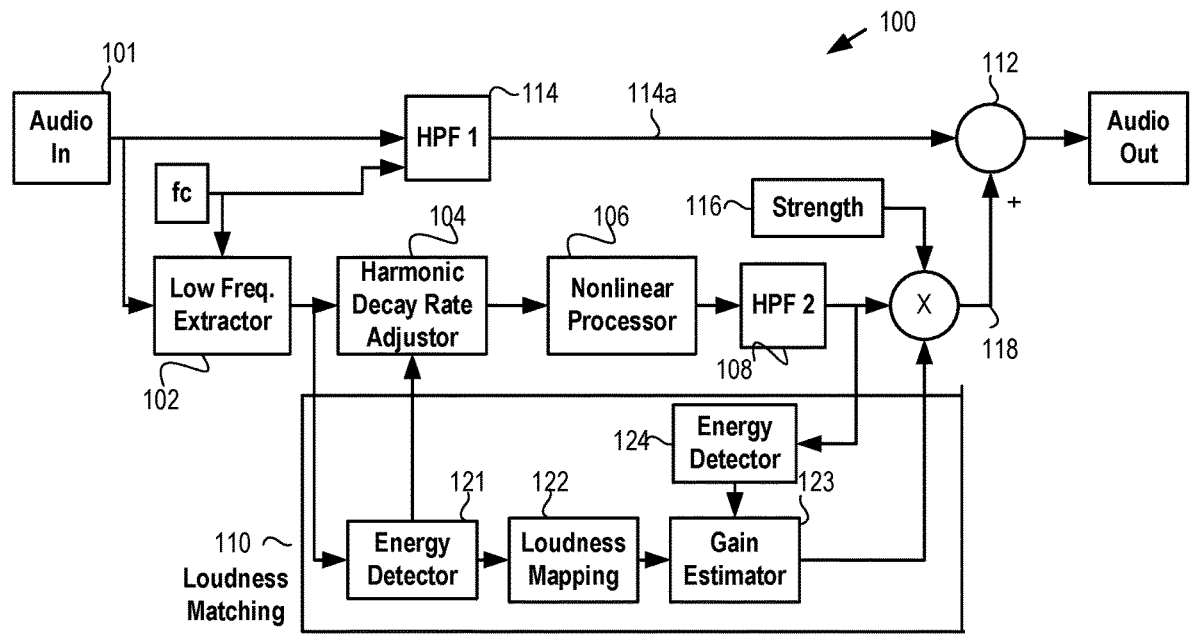
FIG. 1 is a block diagram illustrating a Mono Psychoacoustic Bass System in accordance with one embodiment of the present invention.

The bass generation system in accordance with embodiments of the present invention includes adaptive adjustment of harmonic decay pattern and a specialized non-linear processor (NLP). The non-linear processor is preferably controllable to reduce inter modulation; the non-linearity is controlled to remain independent of the cutoff frequency of speakers and the level of the input audio signal FIG. 1 illustrates one embodiment of the invention. The bass generation system 100 preferably includes six processing units applied to modify an audio input signal 101: (1). low frequency signal extractor 102, (2). automatic adjustor of harmonic decay pattern 104, (3). nonlinear processor (NLP) 106 for generating the desired harmonic signals, (4). high-pass filter 108 to obtain the harmonics that can be reproduced well by the loudspeaker, (5). loudness matching block 110 to match the loudness of the desired harmonics with the original low frequency signal which is unable to be reproduced by the loudspeaker so as to generate the psychoacoustic bass, and (6).output mixer 112 which sums the high-pass filtered raw data 114$a$ with the strength-controlled psychoacoustic bass 118.

The Low Frequency Signal Extractor 102 preferably consists of two cascaded second order IIR filters, which are related to the cutoff frequency fc of the speakers.

The Harmonic Decay Rate Adjustor 104 is implemented, in a preferred embodiment, by an automatic gain related to the input level or fc. For example and referring to FIG. 1, the Energy Detector 121 is used to provide an adjustment control signal 125 to the harmonic decay rate adjustor 104. Details for one of the implementations are as follows.

$$\text{EnergyEnv\_LF}(n)=\text{EnergyEnv\_LF}(n-1)+k*(|\text{input}(n)|-\text{EnergyEnv\_LF}(n-1)); \quad (1)$$

In which k is a time constant around 30 ms.
AdjustGain=1.0;

$$\text{if (EnergyEnv\_LF}(n)<\text{Threshold)} \\ \text{AdjustGain=Threshold/EnergyEnv\_LF}(n); \quad (2)$$

if (AdjustGain>MaxGain) AdjustGain=MaxGain;
output(n)=input(n)*AdjustGain; In which the Threshold is an adjustable parameter, which could control the harmonic decay rate of the proposed NLP.

The Nonlinear Processor is designed as a fifth order polynomial in one embodiment. One non-limiting example of the NLP is as follows, $$y(n)=h_0+h_1 x(n)+h_2 x^2(n)+h_3 x^3(n)+h_4 x^4(n)+h_5 x^5(n) \quad (3)$$

in which
$h_0$=1.0,
$h_1$=0.69314718 0559945,
$h_2$=0.24022650 6959101,
$h_3$=0.05550410 86648216,
$h_4$=0.00961812 910762848,
$h_5$=0.00133335 581464284

Figure 2:
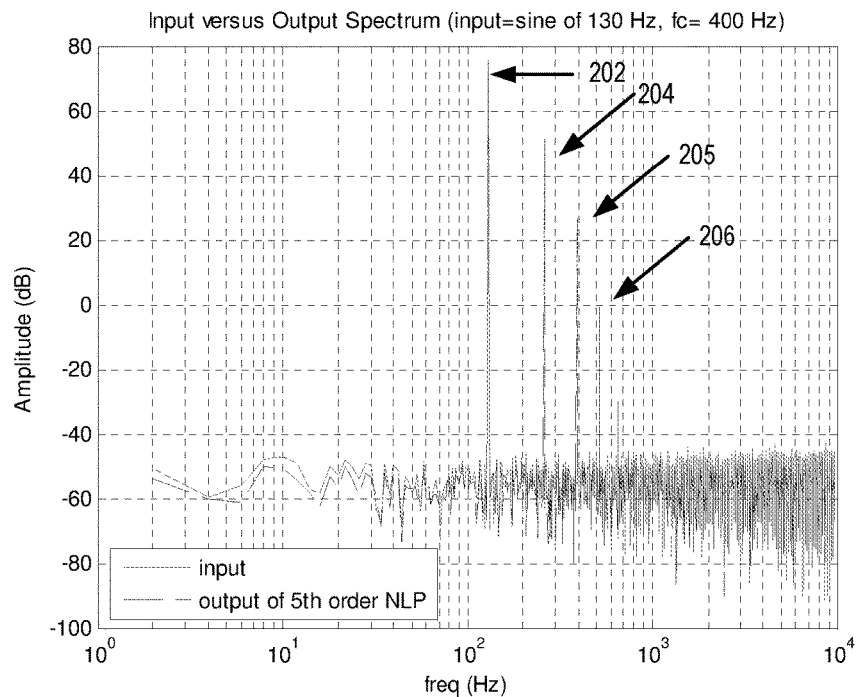
FIG. 2 is a graphical representation illustrating a spectrum of the input and output of a non-linear processor in accordance with one embodiment of the present invention.

FIG. 2 shows the spectrum of the input and output of the proposed fifth order NLP. This proposed NLP doesn't require the LPF at the output of NLP; in contrast, the conventional psychoacoustic bass systems typically need a LPF to reduce the strength of the undesired higher harmonics in order to avoid distortion. FIG. 2 illustrates an input 202 at 130 Hz. And fundamental frequency output signals 204, 205, and 206 respectively at about 260 Hz., 320 Hz., and 420 Hz.

It should be noted that, by adjusting the individual coefficients of the proposed polynomial NLP according to embodiments of the invention, we could also control the harmonic decay rate.

In FIG. 1, HPF 1 (reference number 114) and HPF 2 (reference number 108) are preferably the same IIR filters to increase the loudspeaker efficiency. The HPF 2 (108) also functions to filter out the DC component for better estimation of the energy. The Harmonic Strength 116 applied for the psychoacoustic bass is preferably a user adjustable parameter.

Referring to Loudness Matching block 110, Energy Detector 121 has been described in Equation (1). The Loudness Mapping could be implemented in linear domain (rather than in dB domain) as follows $$\text{output}(n)=c*[\text{input}(n)]^\rho \quad (4)$$

where $\rho$ is the expansion ratio which is between 1.1 and 2.0 and related to the fc. The parameter c is a factor around 1.0. A look-up table method or polynomial approximation could be adopted to implement the power function for reducing the computational complexity.

Figure 3:
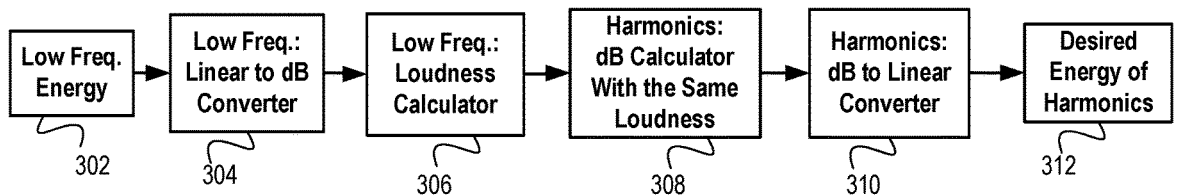
FIG. 3 is a diagram illustrating further details of the Loudness Matching block shown in FIG. 1, in accordance with one embodiment of the present invention.

A sophisticated implementation of the Loudness Mapping 122 (from FIG. 1) is shown as in FIG. 3. Initially in step 302 the low frequency energy for the low frequency extracted signal is determined. Next, in step 304, the energy value is converted from a linear value to a decibel value. A loudness calsulation is then made for the low frequency energy in step 306. In step 308 a dB calculation is made for the same loudness value that corresponds to the desired harmonics. In step 310 the dB value is converted to a Linear value resulting in a determination of the desired energy level of the harmonics in step 312. This value is then used to provide a gain estimation (see gain estimator 123) when the energy level detected for the harmonics 124 is compared with the desired energy of the harmonics (step 312).

The relationship between the Loudness (in phon) and Energy (in dB) (i.e., the equal-loudness contours) is described as follows, $$\text{Loudness}(phon) = 4.2 + \frac{a(f)(\text{Energy} - T(f))}{1 + b(f)(\text{Energy} - T(f))} \quad (5)$$

where the frequency-dependent parameters a(f), b(f), and T(f) are defined as $$a(f) = -3.3378*10^{-19} f^5 + 1.0889*10^{-14} f^4 - 1.2776* 10^{-10} f^3 + 6.5607*10^{-7} f^2 - 0.0014 f + 1.8113$$

$$b(f) = -9.1993*10^{22} f^5 + 3.1889*10^{-17} f^4 - 4.0519* 10^{-13} f^3 + 2.3588*10^{-9} f^2 - 5.9306 f + 0.0040$$

$$T(f) = 9.3706*10^{-21} f^6 - 3.0490*10^{-16} f^5 + 4.1801*10^{-12} f^4 - 2.6922*10^{-8} f^3 + 8.3228*10^{-5} f^2 - 0.1115 f + 46.48 \quad (6)$$

Figure 4:
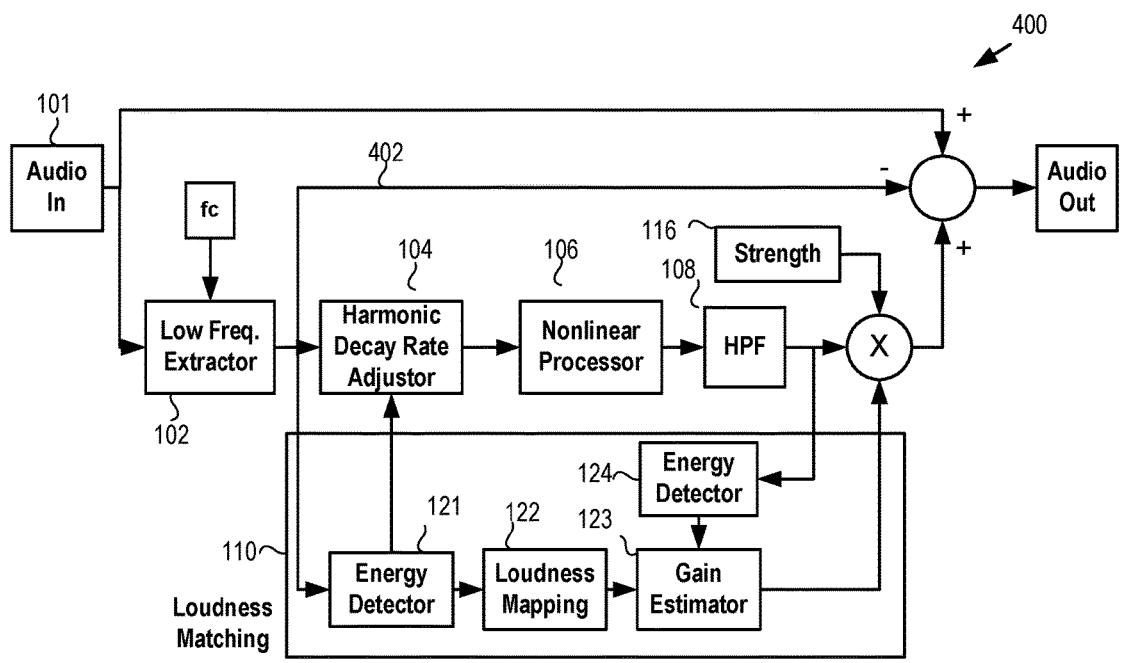
FIG. 4 is a block diagram illustrating a Mono Psychoacoustic Bass System in accordance with one embodiment of the present invention.

A simplified psychoacoustic bass system 400 is depicted in FIG. 4, in which the HPF 1 (reference number 114) of FIG. 1 is implemented by subtracting the extracted low-frequencies 402 from the raw audio data 101.

Figure 5:
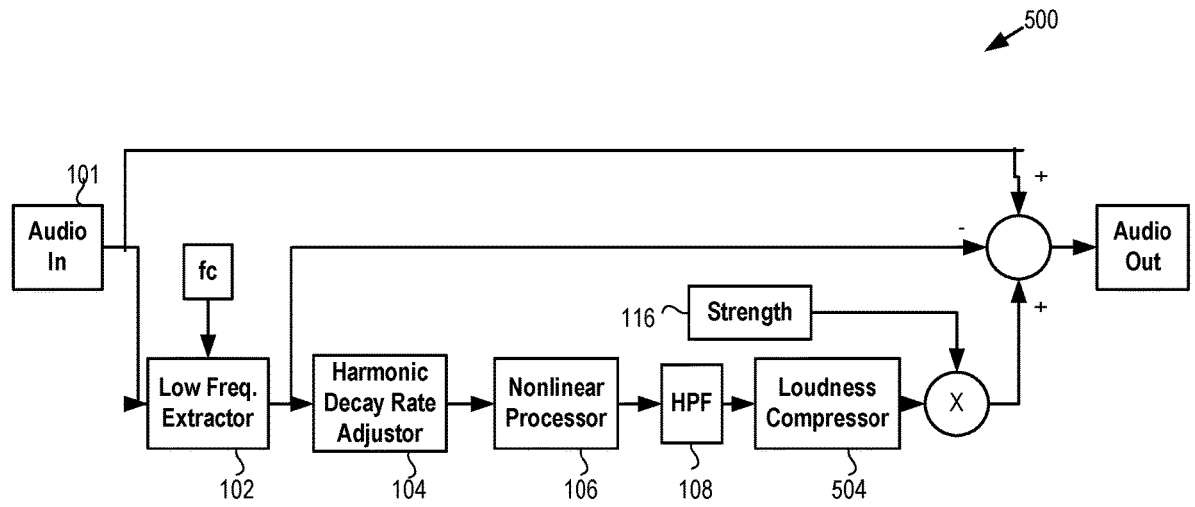
FIG. 5 is a block diagram illustrating a Mono Psychoacoustic Bass System in accordance with one embodiment of the present invention.

Another simplified psychoacoustic bass system 500 is illustrated in FIG. 5. Replacing the Loudness Matching block (110 in FIG. 1) by a Loudness Compressor 504 will further save the MIPS with acceptable performance of the low frequency sensation.

The loudness Compressor is implemented by an Energy Detector, Gain Calculator, and a smoother. As the NLP might result in the excessive expansion effect, the Loudness Compressor will compensate for the excessive expansion based on the Equal Loudness Contours in the low frequency range of interest.

Figure 6:
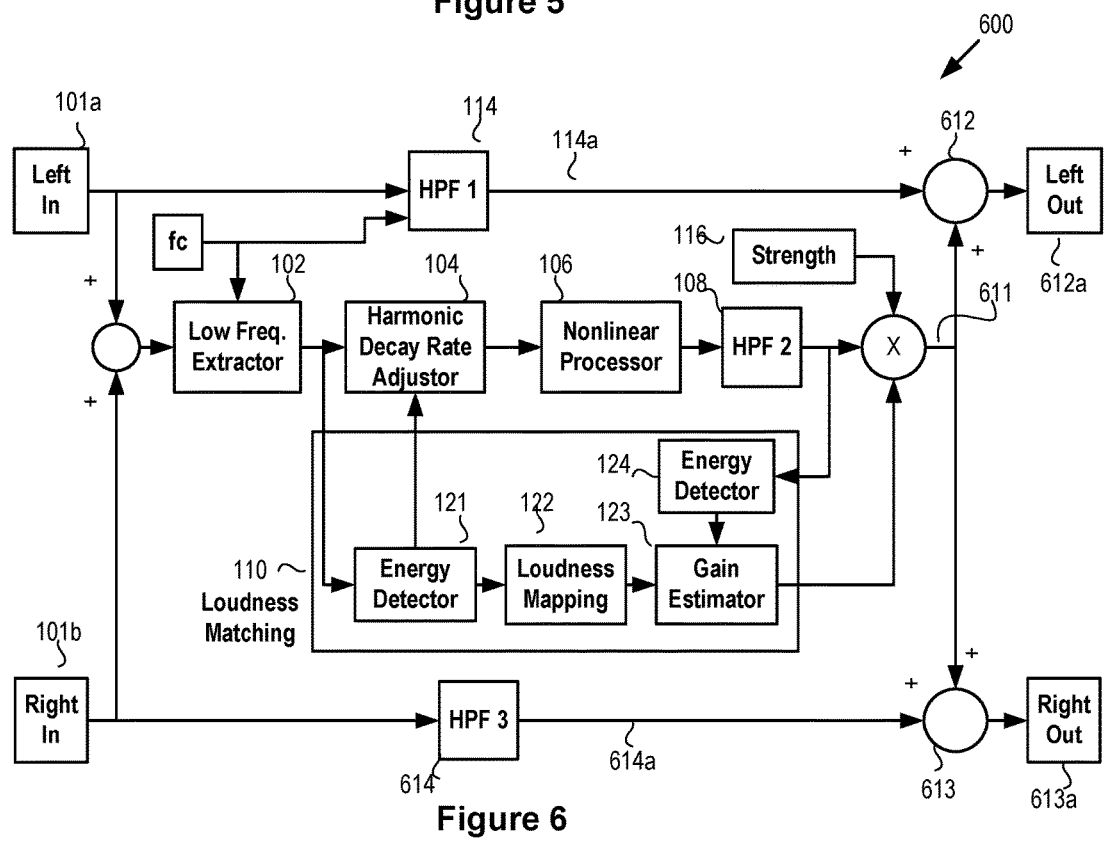
FIG. 6 is a block diagram illustrating a Stereo Psychoacoustic Bass System in accordance with one embodiment of the present invention.

The proposed mono schemes could be easily generalized to the cases of stereo input or more than two channel inputs. One embodiment of the invention for the stereo input case is shown in FIG. 6, which is based on the mono system of FIG. 1. In the shown Stereo Psychoacoustic Bass System 600 the HPF 1 (reference number 114), HPF 2 (reference number 116), and HPF 3 (reference number 614) use the same filter coefficients. The first and second input audio channels (101a, 101b) are combined, then the combined signal is processed by the low frequency extractor 102. Further, the psychoacoustic bass signal 611 is added respectively in adders/mixers 612,613 to the high pass filtered left channel signal 114a and the high pass filtered right channel signal 614a to generate respectively the left out signal 612a and the right out signal 613a.

Figure 7:
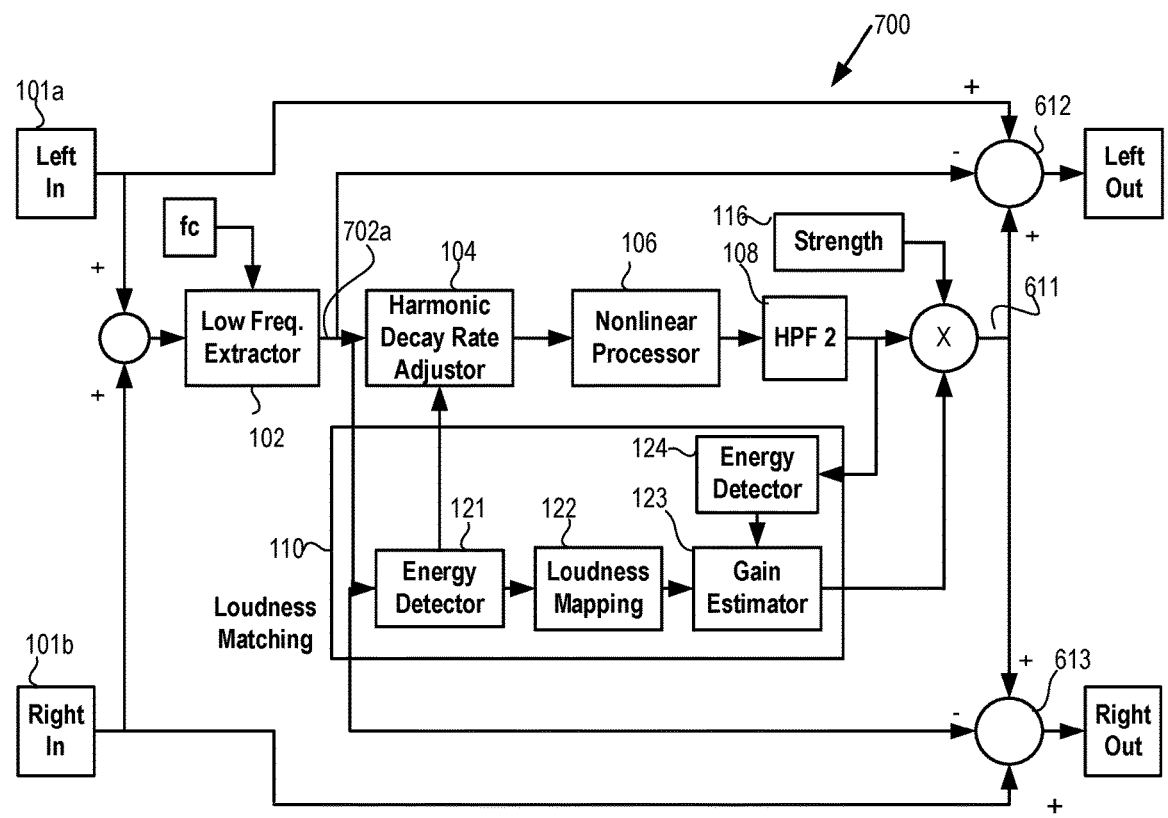
FIG. 7 is a block diagram illustrating a simplified Stereo Psychoacoustic Bass System having a reduced number of high-pass filters in accordance with one embodiment of the present invention.

FIG. 7 shows a simplified stereo psychoacoustic bass system 700 which saves (i.e., reduces the need for) two HPFs. It is based on the mono system of FIG. 4. That is, the high pass filter functionality shown by high pass filter 114 and 614 in FIG. 6 are replaced by subtracting the low frequency extracted signal 702a from the left channel input signal 101a and the right channel input signal 101b.

Figure 8:
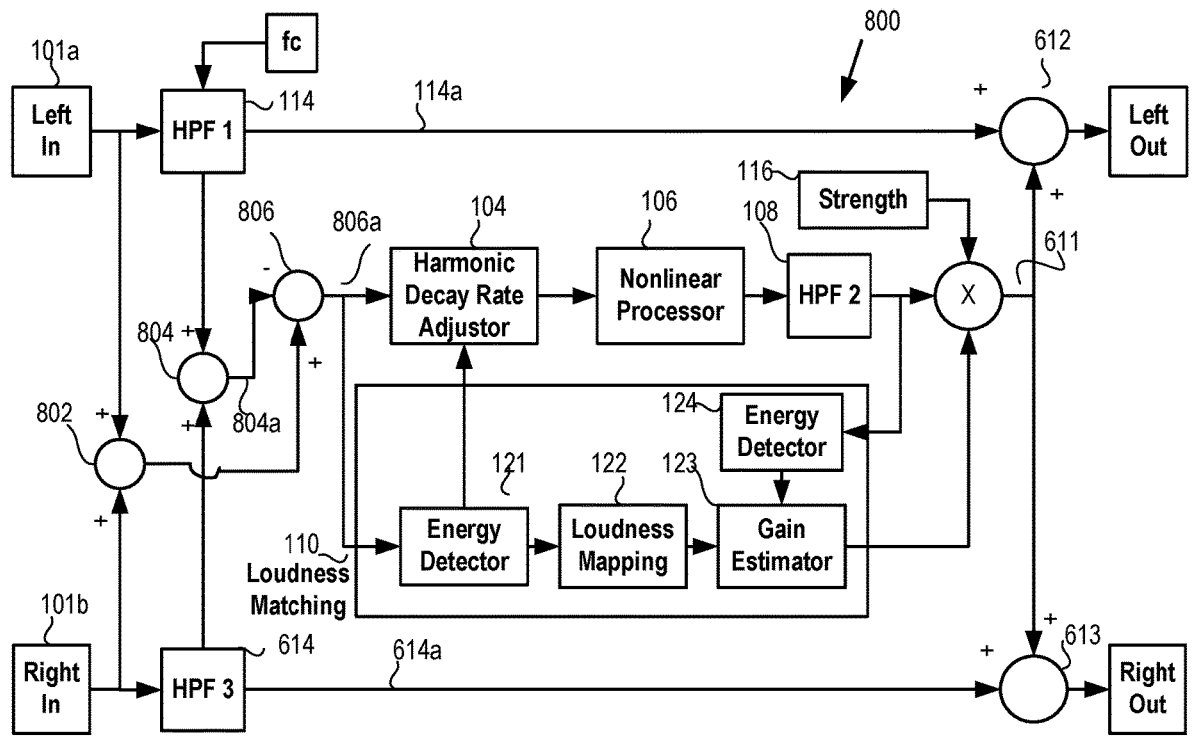
FIG. 8 is a block diagram illustrating a simplified Stereo Psychoacoustic Bass System having a simplified low frequency extractor in accordance with one embodiment of the present invention.

FIG. 8 is a block diagram illustrating a simplified Stereo Psychoacoustic Bass System 800 having a simplified low frequency extractor in accordance with one embodiment of the present invention. In this embodiment, the left input signal 101a and the right input signal 101b are combined in adder 802. The high pass filtered signals 114a and 614a derived respectively form these input channel signals are combined in adder 804. The combined high pass filtered signals 804a are then subtracted from the combined input signals in adder 806 to generate an extracted low frequency signal 806a.

In the embodiments described above, the psychoacoustic bass processing is performed with a single band, but it could be easily generalized to the cases of multiple bands. Utilizing up to three bands processing should provide more than satisfactory performance for the speakers with fc less than 1000 Hz.

The proposed adaptive psychoacoustic bass system is expected to provide several advantages. In comparison with the prior art, the novelties and advantages of this proposed scheme can be summarized as follows:

(1). An effective NLP is used so as to avoid a Low Pass Filter (LPF) at the output of NLP and to reduce the artifacts.

(2) The inter-modulation existing in all conventional systems is greatly reduced and can be controlled so as to be inaudible with this invention.

(3). As a result of using the proposed "adaptive adjustor of harmonic decay pattern" in this invention, the harmonics of the present inventive system will not diminish when the input level is low or when the cutoff frequency of the speaker is very low.

(4). The harmonic decay rate can be controlled by either the above block or by adjusting the coefficients of the NLP.

(5). With the added use of the loudness matching block, this invention greatly enhances the perceived low frequency sensation.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A bass enhancement system comprising:
    an adaptive low frequency signal extractor configured to extract low frequency signals from an input audio signal;
    a nonlinear processor configured to generate from the low frequency signals harmonic signals having inter-modulation controllable to remain below a threshold level;
    an adaptive adjustor configured to set a gain used with the nonlinear processor for adjusting harmonic signal decay associated with the harmonic signals;
    a high-pass filter positioned in the output path from the nonlinear processor and configured to pass harmonic signals which are reproducible by an output transducer; and
    an output mixer which sums high-pass filtered input audio signals with psychoacoustic bass corresponding to the harmonic signals generated by the nonlinear processor.

2. The system as recited in claim 1 further comprising a loudness matching block configured to compensate the loudness of the desired harmonics to match the loudness of the low frequency signals.

3. The system as recited in claim 2 wherein the adaptive adjustor generates a harmonic decay rate that is implemented by an automatic gain related to at least one of an input audio level or the cut-off frequency of the output transducer.

4. The system as recited in claim 1 wherein the adaptive adjustor generates full-harmonic generation and inaudible inter-modulation.

5. The system as recited in claim 1 wherein the nonlinear processor generates both even and odd harmonics.

6. The system as recited in claim 1 wherein the nonlinear processor is designed as a fifth order polynomial.

7. The system as recited in claim 2 wherein the output path from the nonlinear processor to the output mixer does not include a low pass filter.

8. The system as recited in claim 1 wherein the system filters out low frequency signals from the audio input signal by subtracting the output of the low frequency extractor from the audio input signal.

9. The system as recited in claim 2 wherein the loudness matching is performed by a loudness compressor.

10. The system as recited in claim 9 wherein the loudness compressor operates on a high pass filtered output from the nonlinear processor.

11. The system as recited in claim 2 configured to adjust the harmonic decay rate optionally by controlling the adaptive adjustor of harmonic decay pattern or by altering the coefficients of the nonlinear processor.

12. The system as recited in claim 2 wherein the audio signal comprises at least a first and second channel and the output mixer comprises a first and second channel output mixer, and wherein the low frequency extraction is applied to a combination of the first and second channels and the harmonics passed by the high pass filter are added to both the first and second output mixers.

13. A method for changing the frequency characteristics of an audio signal to enhance bass perception, the method comprising:
    extracting low frequency components from the audio signal;
    generating harmonic signals using a nonlinear processor that operates on the low frequency components and controls inter-modulation to remain below a threshold value;
    adjusting harmonic signal decay associated with the harmonic signals adaptively by setting a gain used with the nonlinear processor; and
    adding the adjusted harmonic signals to the audio signal.

14. The method as recited in claim 13 further comprising compensating the loudness of the desired harmonic signals to match the loudness of the original extracted low frequency signal.

15. A computer program product for enhancing bass perception of an audio signal reproducible on a loudspeaker in a listening space, the computer program product being embodied in a non-transitory computer readable medium and comprising computer executable instructions for:
    receiving the audio signal;
    extracting low frequency components from the audio signal;
    generating harmonic signals using a nonlinear processing method that controls inter-modulation to remain below a threshold value, and
    adjusting the harmonic signals adaptively, by setting a gain used with the nonlinear processor so that the signal decay associated with the harmonic signals is responsive to a measurement of the low frequency components.

16. The system as recited in claim 1 wherein the adaptive adjustor of the harmonic signals decay is responsive to automatic gain related to the level of the signal from the low frequency signal extractor.

17. The system as recited in claim 6 wherein the nonlinear processor is a polynomial non-linear processor and the harmonic decay rate is controlled by adjusting the individual coefficients of the polynomial non-linear processor.

18. The method as recited in claim 13 wherein adjusting the harmonic decay pattern adaptively is based on an automatic gain related to the level of the extracted low frequency components.

19. The system as recited in claim 1 wherein the nonlinear processor is configured to generate the harmonic from the output of the adaptive adjustor of harmonic decay pattern.

20. The method as recited in claim 15 wherein the adjusting the harmonic decay pattern adaptively is applied to the input for the generation of harmonic signals.

* * * * *